United States Patent [19]

Kuwana et al.

[11] Patent Number: 5,394,525
[45] Date of Patent: Feb. 28, 1995

[54] IMAGE MEMORIZING DEVICE UTILIZING THE SIGNIFICANCE OF UNAVAILABLE DATA

[75] Inventors: Ichiro Kuwana, Musashino; Koichi Ueda, Yokohama; Hirofumi Nakajima, Kamakura, all of Japan

[73] Assignee: Canon Kabushiki Kaisha, Tokyo, Japan

[21] Appl. No.: 911,878

[22] Filed: Jul. 10, 1992

[30] Foreign Application Priority Data

Jul. 16, 1991 [JP] Japan .................. 3-175601
Jul. 16, 1991 [JP] Japan .................. 3-175603
Jul. 16, 1991 [JP] Japan .................. 3-175604

[51] Int. Cl.6 ............................. G06F 15/62
[52] U.S. Cl. ..................... 395/164; 348/246; 348/247
[58] Field of Search .......... 358/213.17, 335, 213.15; 395/164, 166; 382/56; 345/28, 199, 145, 185; 348/247, 246

[56] References Cited

U.S. PATENT DOCUMENTS 4,951,147 8/1990 Aknar et al. .................. 358/209
5,144,446 9/1992 Sudo et al. .................. 358/213.11
5,200,959 4/1993 Gross et al. .................. 371/21.6

*Primary Examiner*—Robert L. Richardson
*Attorney, Agent, or Firm*—Morgan & Finnegan

[57] ABSTRACT

There is disclosed a device in which detection data regarding whether the write data into a memory to store image data and the read-out data coincide or not is generated every unit data amount and the access to the memory is controlled in accordance with evaluation data obtained by evaluating the detection data in accordance with a degree of influence on an image, thereby enabling the memory to be effectively used. Information indicative of the degree of influence on the image includes the bit position of the pixel data consisting of a plurality of bits, the position of each pixel data on the screen, the density of pixels corresponding to the invalid memory cells in the memory, and the like.

31 Claims, 12 Drawing Sheets

FIG. 3
| | LSB | | | | | | | MSB |
|---|---|---|---|---|---|---|---|---|
| bit | 0 | 1 | 2 | 3 | 4 | 5 | 6 | 7 |
| WEIGHT | W0 | W1 | W2 | W3 | W4 | W5 | W6 | W7 |
| (NUMERICAL EXAMPLE) | ( 0 | 0.1 | 0.2 | 0.3 | 0.4 | 0.5 | 0.6 | 0.7 ) |
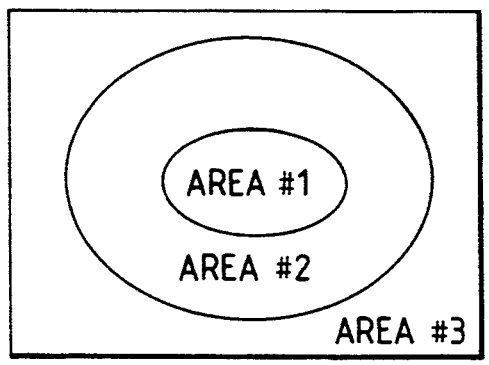
FIG. 4A
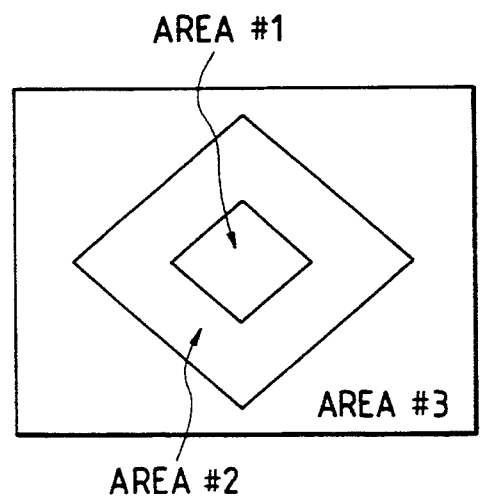
FIG. 4B

FIG. 5

AREA #1

| bit | 0 | 1 | 2 | 3 | 4 | 5 | 6 | 7 |
|---|---|---|---|---|---|---|---|---|
| WEIGHT | a0 | a1 | a2 | a3 | a4 | a5 | a6 | a7 |
| (NUMERICAL EXAMPLE) | 0.2 | 0.3 | 0.4 | 0.5 | 0.6 | 0.7 | 0.8 | 1 |

LSB → MSB

AREA #2

| bit | 0 | 1 | 2 | 3 | 4 | 5 | 6 | 7 |
|---|---|---|---|---|---|---|---|---|
| WEIGHT | b0 | b1 | b2 | b3 | b4 | b5 | b6 | b7 |
| (NUMERICAL EXAMPLE) | 0 | 0 | 0.2 | 0.3 | 0.4 | 0.5 | 0.6 | 0.7 |

LSB → MSB

AREA #3

| bit | 0 | 1 | 2 | 3 | 4 | 5 | 6 | 7 |
|---|---|---|---|---|---|---|---|---|
| WEIGHT | c0 | c1 | c2 | c3 | c4 | c5 | c6 | c7 |
| (NUMERICAL EXAMPLE) | 0 | 0 | 0 | 0 | 0.2 | 0.3 | 0.4 | 0.5 |

LSB → MSB

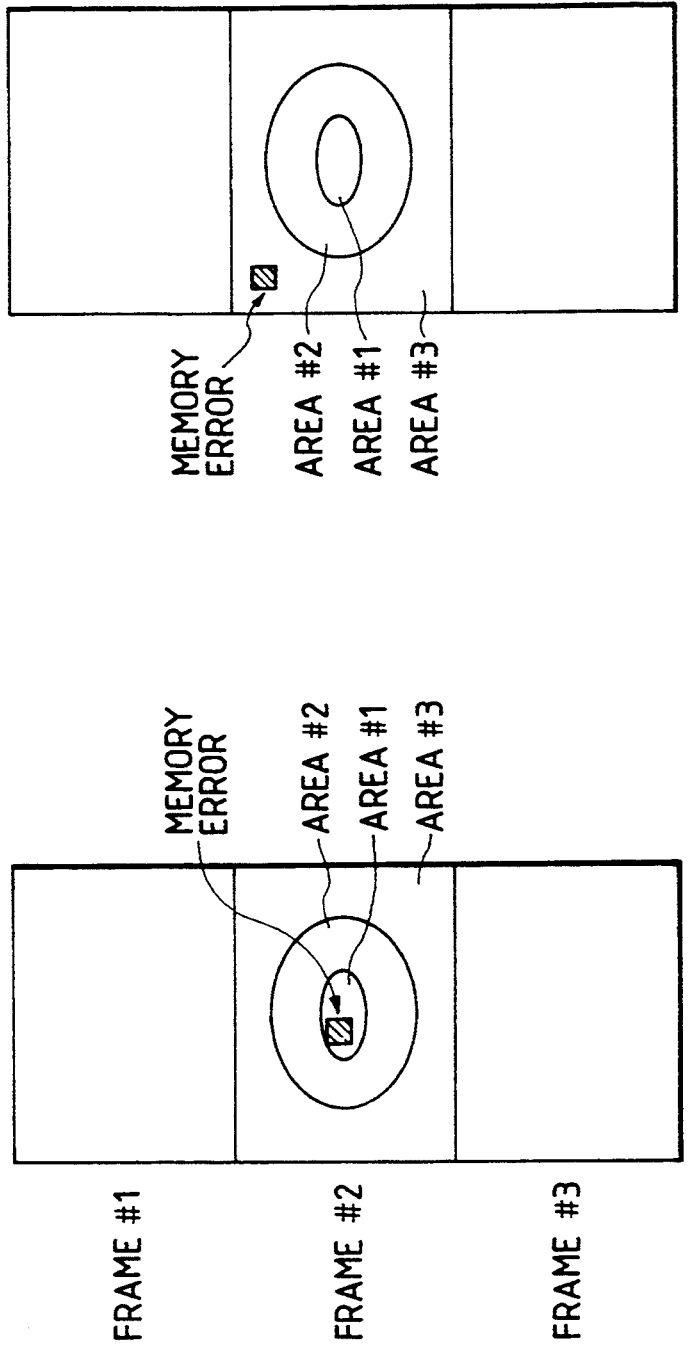

$$\text{EVALUATION VALUE ER} = \sum_{i=1}^{n} \frac{1}{\sqrt{x_i^2 + y_i^2}}$$

IMAGE MEMORIZING DEVICE UTILIZING THE SIGNIFICANCE OF UNAVAILABLE DATA

BACKGROUND OF THE INVENTION

1. Field of the Invention

The invention relates to an image memorizing device and, more particularly, to an image memorizing device having a memory of a large capacity.

2. Related Background Art

In conventional image memorizing devices, there are many devices which don't check a memory error. Even in case of the image memorizing devices which check a memory error, an error message is merely displayed or a memory bank is merely simply exchanged.

According to the method of switching the memory bank, however, many normal memory cells are sacrificed by a few memory errors, so that it is largely wasteful.

SUMMARY OF THE INVENTION

Under such circumstances, it is an object of the invention to provide an image memorizing device which can solve an inconvenience as mentioned above.

Another object of the invention is to provide an image memorizing device in which a memory can be effectively used and an adverse influence on the image is small.

Under such objects, according to the invention, as an embodiment, there is disclosed an image memorizing device comprising: (a) memory means for storing image data; (b) detecting means for generating detection data regarding whether write data into the memory means coincides with read-out data or not every unit data amount; (c) evaluating means for evaluating the detection data in accordance with a degree of influence on an image and for generating evaluation data; and (d) control means for controlling an access to the memory means in accordance with the evaluation data.

The above and other objects and features of the present invention will become apparent from the following detailed description and the appended claims with reference to the accompanying drawings.

BRIEF DESCRIPTION OF THE DRAWINGS

FIG. 3 is an explanatory diagram regarding a weight coefficient of every bit;

FIGS. 4A and 4B are diagrams showing examples of the area division on a screen;

FIG. 5 is an explanatory diagram regarding a weight coefficient of every bit for data of each area in FIGS. 4A and 4B;

FIGS. 7A and 7B are diagrams showing states in the case of rearranging addresses which caused a memory error;

DETAILED DESCRIPTION OF THE PREFERRED EMBODIMENTS

Embodiments of the invention will be described hereinbelow with reference to the drawings.

Figure 1:
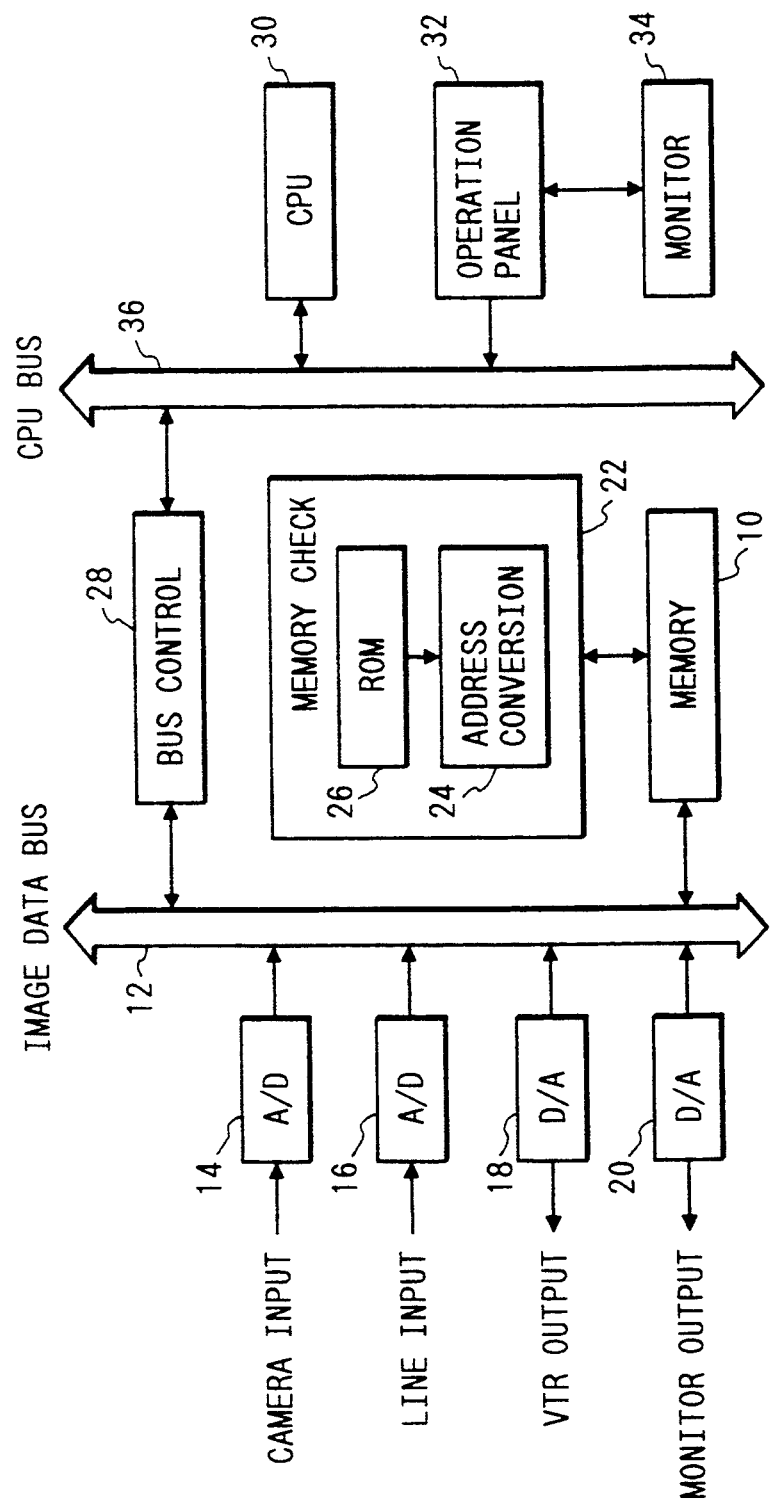
FIG. 1 is a block diagram showing a whole construction of an image memorizing device according to an embodiment of the invention.

FIG. 1 is a block diagram showing a construction of an embodiment of the invention. In FIG. 1, reference numeral 10 denotes a memory to store image data. The memory 10 has a memory capacity enough to store a plurality of frames. Reference numeral 12 denotes an image data bus to input/output the image data into/- from the memory 10; 14 and 16 A/D converting circuits each for converting an analog video signal into a digital signal; and 18 and 20 D/A converting circuits each for receiving the image data read out of the memory 10 from the image data bus 12 and converting into the analog signal and generating.

In the embodiment, the A/D converter 14 is used for input of the image data from a video camera, the A/D converter 16 is used for line input from the outside, the D/A converter 18 is used for output of the image data to a VTR, and the D/A converter 20 is used for output to a monitor.

Reference numeral 22 denotes a memory checking circuit to check memory cells in the memory 10 on a bit or byte unit basis. The memory checking circuit 22 has an address conversion table 24 for converting real addresses in the memory 10 into frame units and predetermined bank units in the frame. Initial values of the address conversion table 24 have been stored in an ROM 26.

Reference numeral 28 denotes a bus control circuit to control the input/output of data among the A/D converters 14 and 16, the D/A converters 18 and 20, and the memory 10 through the image data bus 12. Reference numeral 30 denotes a CPU to control the whole device; 32 an operation panel which is used for the user to input a predetermined command; 34 a monitor to display the operation content; and 36 a CPU bus to mutually connect the CPU 30, operation panel 32, and bus control circuit 28.

The memory checking circuit 22 in the embodiment checks the content of the memory 10 by a software arithmetic operation in accordance with the turn-on of a power source or an execution command input from the operation panel 32.

Figure 2:
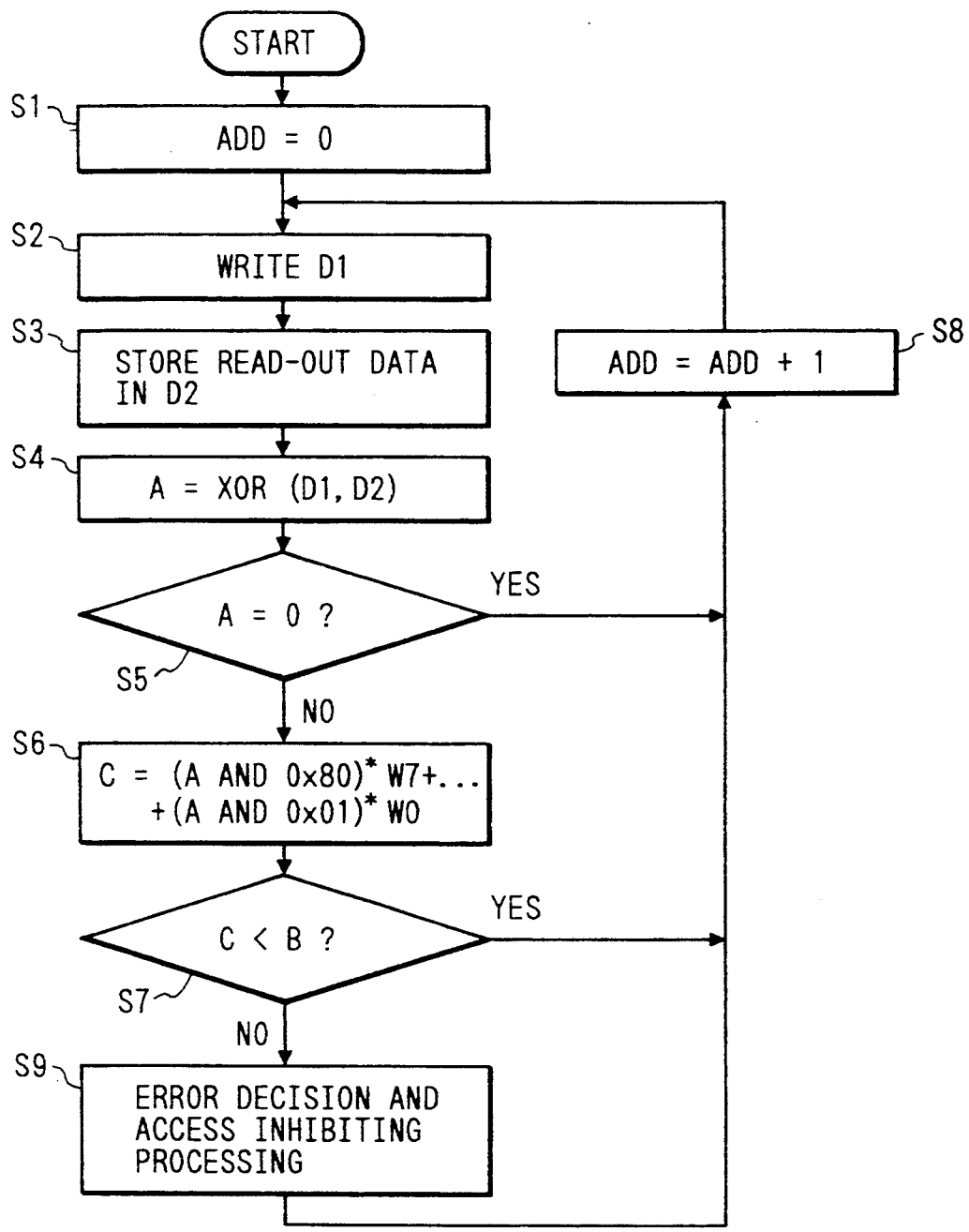
FIG. 2 is a flowchart showing the first operation example of a memory checking circuit in FIG. 1.

FIG. 2 is a flowchart showing the first example of the checking operation of the memory checking circuit 22. The memory checking circuit 22 first resets an address counter to access to the memory 10 (step S1). Data $D_1$ of eight bits is written into an address ADD (step S2). The stored data is read out from the same address ADD and stored into a variable $D_2$ (step S3). The exclusive OR of the written 8-bit data $D_1$ and the read-out 8-bit data $D_2$ is obtained every bit and compared (S4). A check is made to see if the comparison result A indicates "0" (coincidence with respect to all of the bits) or a value other than 0 (namely, dissidence) (S5). When they coincide with respect to all of the bits, the address ADD is increased by "1" (S8). The writing and reading operations are executed with respect to all of the addresses in the memory 10 and a coincidence detection is executed every address. When the MSB doesn't coincide, the comparison result A is set to "10000000" of eight bits and to "80" in case of the hexadecimal notation. When the MSB, the fourth and second bits, and the LSB don't coincide, the comparison result A is set to "10010101" of eight bits and to "95" in case of the hexadecimal notation.

When the written data $D_1$ and the read-out data $D_2$ differ (S5), weight coefficients $W_0$ to $W_7$ for the bits which don't coincide are added (S6). As shown in FIG. 3, $W_0$ denotes the weight coefficient for the least significant bit (LSB) of one byte (eight bits) and $W_7$ denotes the weight coefficient for the most significant bit (MSB). Since an influence on the bit on the MSB side by an error is large, for instance, a large weight of 0.7 is given to $W_7$. Since an influence on the bit on the LSB side by an error is small, for example, $W_0$ is set to 0. "0x" in step S6 indicates the hexadecimal number. In step S6, by calculating the AND of A and "80" of the hexadecimal number, its output is set to "80" only when the MSB doesn't coincide. ( )* denotes that when the value in ( ) is equal to 0, the value of ( )* is set to 0, and when the value in ( ) is equal to a value other than 0, the value of ( )* is set to 1.

An evaluation value C obtained in step S6 is compared with a threshold value B of the subjective evaluation (S7). When C is smaller than B, this means that the error is small and it is considered that the image quality is not largely adversely influenced, so that the next address is examined (S8) in a manner similar to the case of no error.

When C is equal to or larger than B, it is determined that the error occurs (S9). The access to the relevant memory cell is inhibited on a byte unit basis. That is, the content in the address conversion table 24 is rewritten so that the memory cell cannot be accessed. It is also obviously possible to inhibit the access to a memory area in a predetermined range including the error occurrence position.

When the access to the error portion in the memory is inhibited in step S9, the processing routine advances to step S8 in order to again examine the next address.

By the above processes, the error location which exerts an adverse influence on the image to be stored can be eliminated from the access address in the memory 10. That is, the access to only the memory cell in which the bit near the MSB has caused a memory error is disabled as a memory cell which exerts an adverse influence on the image, so that the memory cell in which, for example, only the LSB has caused a memory error can be used and the memory can be efficiently used.

On the other hand, the location of the memory error on the screen exerts a large influence on the image quality. That is, even in case of similar errors, the influence at the center of the screen is larger than the influence at the edge of the screen. In the following embodiment, therefore, there is proposed a method whereby the memory area in the memory 10 is divided into a plurality of areas from a viewpoint of the relation with the display screen and error evaluation references are made different on an area unit basis.

FIGS. 4A and 4B show examples of the divisional areas in the case where the screen is divided into three areas and processes are made different every area. For instance, the central area assumes area #1 and the outside area assumes area #2 and the outermost area assumes area #3. FIG. 4A shows an example in which the screen is divided into circular areas. FIG. 4B shows an example in which the screen is divided into diamond areas. As shown in FIG. 5, different weight coefficients are given to the respective bits in each memory cell in the areas #1, #2, and #3 in a manner such that $a_0$ to $a_7$, $b_0$ to $b_7$, and $c_0$ to $c_7$. As a whole, $a_0$ to $a_7$ are larger than $b_0$ to $b_7$ and $b_0$ to $b_7$ are larger than $c_0$ to $c_7$.

Figure 6:
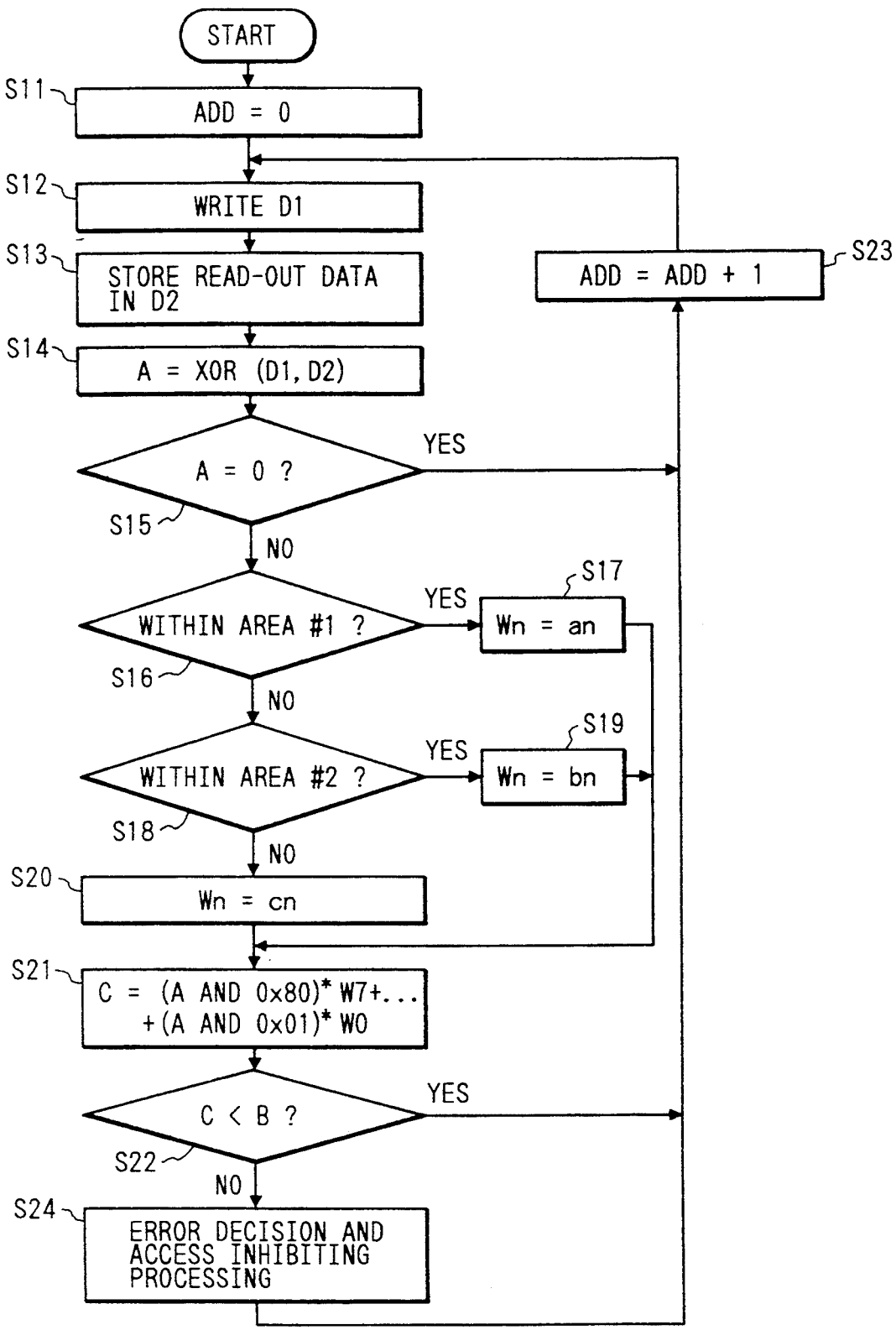
FIG. 6 is a flowchart showing the second operation example of the memory checking circuit in FIG. 1.

FIG. 6 is a flowchart for explaining the second example of the operation of the memory checking circuit 22 according to the method described in FIGS. 4A, 4B, and 5. The processes for initializing the address counter and writing the data $D_1$ into the address ADD and comparing with the data $D_2$ read out from the same address (steps S11 to S15) are substantially the same as those in the processes in steps S1 to S5 in FIG. 2. When the written data $D_1$ and the read-out data $D_2$ coincide with respect to all of the bits, the address ADD is increased by "1" and the next address is checked (step S23).

When an error exists in the area #1, $a_n$ is set as a weight coefficient $W_n$. When an error exists in the area #2, $b_n$ is set as $W_n$. When no error exists in both of the areas #1 and #2, $c_n$ is set as a weight coefficient $W_n$ of the area #3. $a_n$, $b_n$, and $c_n$ are respectively stored into variables $W_n$ for evaluation. (steps S16 to S20).

In a manner similar to step S6 in FIG. 2 mentioned above, the evaluation variable $W_n$ is added with respect to only the dissident bit in step S21. The evaluation value C is calculated (S21) and comapred with the threshold value B for subjective evaluation (S22). When C is smaller than B, this means that the error is small and it is considered that the image quality is not largely adversely influenced, so that the next address is examined as it is (S23).

When C is equal to or larger than B, it is decided that the error occurred (S24) and the access to the relevant memory cell is inhibited on a byte unit basis. That is, the content in the address conversion table 24 is rewritten so as to disable the access. The access to a memory area in a predetermined range including the error occurrence location can be also obviously inhibited.

By the above processes, the memory error is evaluated in accordance with the position on the screen and only the error location which exerts an adverse influence on the display image can be eliminated from the memory 10 and the memory can be further effectively used.

Explanation will now be made with respect to an embodiment in which when a memory error which is equal to or larger than a reference value exists in the memory cell to store the areas #1 and #2 at the center of the screen or in the memory area (block) of a predetermined range, the content in the address conversion table is rewritten and the image data in the area #3 is stored with regard to the memory cell or memory area having the memory error. FIG. 7 is a schematic explanatory diagram of the idea of the method in such an embodiment. A hatched portion indicates a memory cell or block having a memory error that is equal to or larger than a predetermined value. The hatched portion is rearranged in the area #3. Consequently, the memory cell or block with the memory error can be effectively used in a range where no influence is exerted on the picture quality.

Figure 8A:
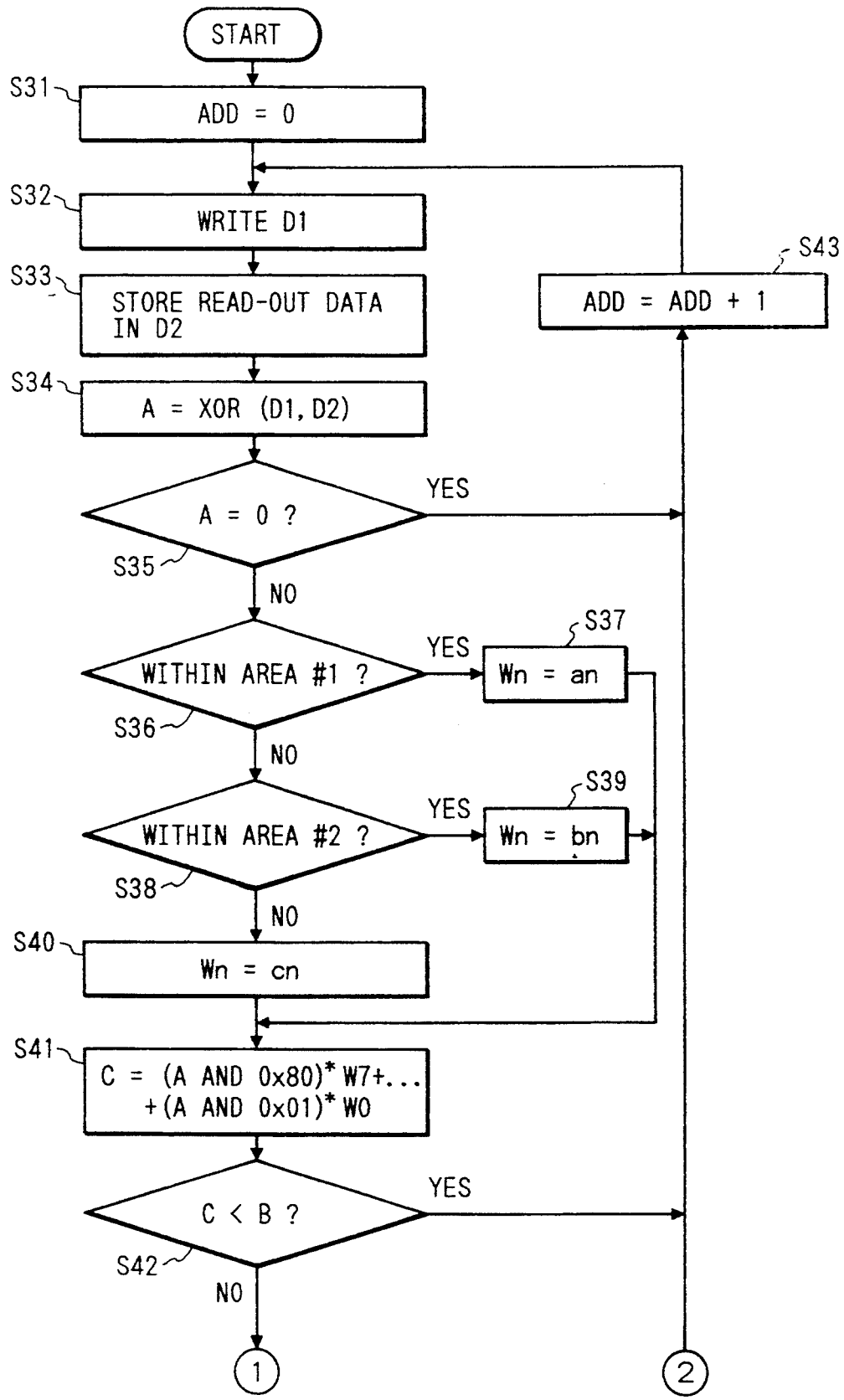
FIGS. 8A and 8B are flowcharts showing the third operation example of the memory checking circuit in FIG. 1.
Figure 8B:
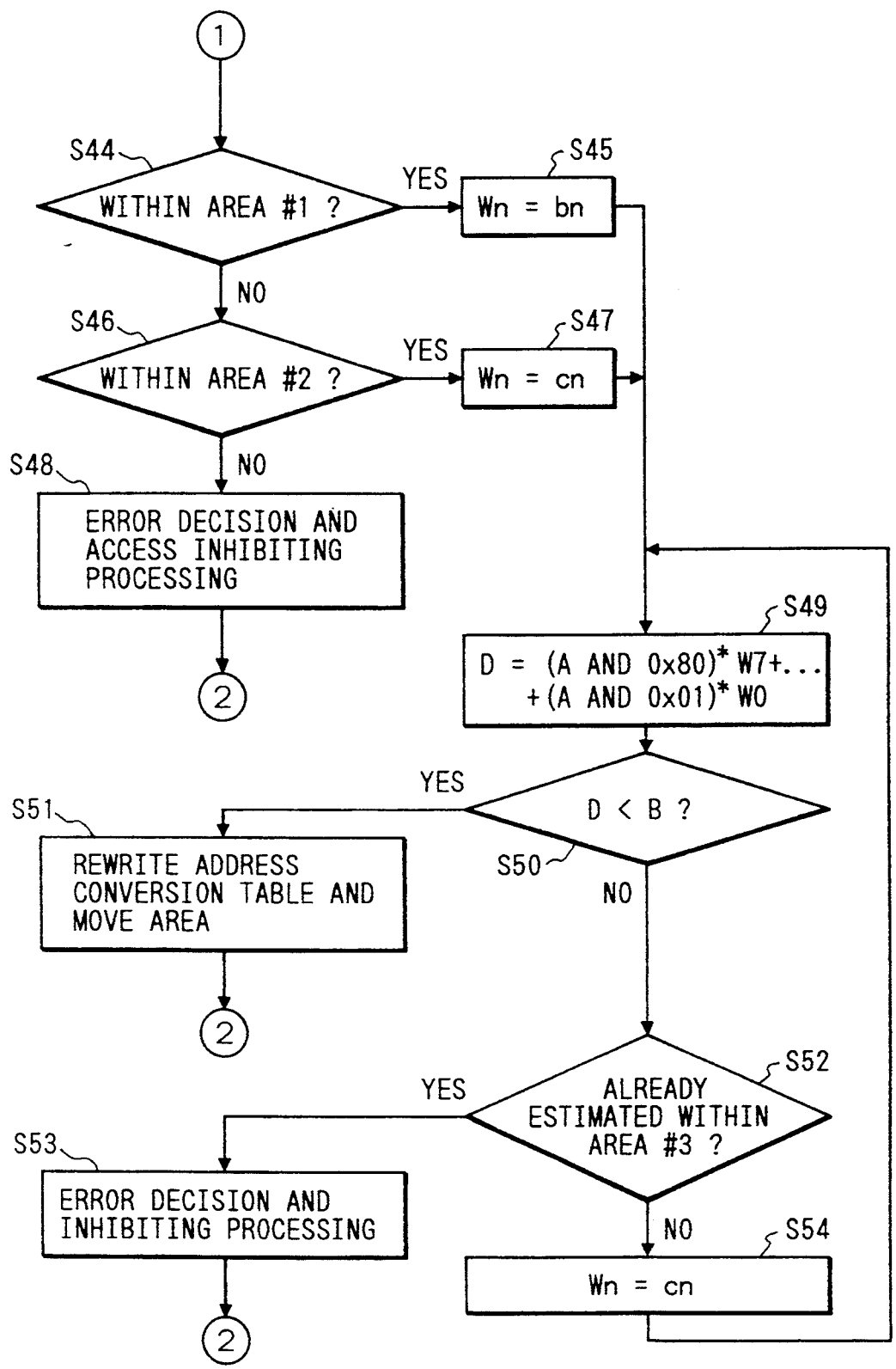

FIGS. 8A and 8B are flowcharts showing the third operation of the memory checking circuit 22 according to the above method. The processes in steps S31 to S43 are substantially the same as those in steps S11 to S23 in FIG. 6. In step S42, the memory area having a memory error which is equal to or larger than the threshold value B can be detected.

When the memory cell or block in which the memory error has occurred is located in the area #1 (S44), the weight coefficient $b_n$ of the area #2 is stored into the variable $W_n$ for evaluation (S45) and the error is again evaluated (S49). When the result D of the re-evaluation is smaller than the threshold value B (S50), the content of the address conversion table 24 is rewritten and the corresponding address in the memory cell or block is moved to the area #2 (S51). When D is equal to or larger than B (S50), the error is again evaluated by the weight coefficient $c_n$ of the area #3 (S54, S49). The result D is again compared with the threshold value B (S50). When D is smaller than B (S50), the content of the address conversion table 24 is rewritten and the corresponding address in the memory cell or block is moved to the area #3 (S51). In this instance, when D is again equal to or larger than B (S50), this means that the evaluation is executed within the area #3 (S52), so that it is determined that the error occurred in such a memory cell or block and the use of the address is inhibited (S53).

When the memory cell or block which is decided in step S42 such that the memory error occurred is located within the area #2 (S46), the weight coefficient $c_n$ of the area #3 is stored into the variable $W_n$ for evaluation (S47) and the error is again evaluated (S49). When the result D of the re-evaluation is smaller than the threshold value B (S50), the content of the address conversion table 24 is rewritten and the corresponding address in the memory cell or block is moved to the area #3. In this case as well, when D is equal to or larger than B in step S49, it is decided that the error occurred in such a memory cell or block, and the access to the address is inhibited (S53).

Further, when the memory cell or block which is determined in step S42 such that the memory error occurred is located in the area #3, it is immediately decided that such a memory cell or block has an unusable error, and the access to the address is inhibited (S48).

By the above embodiment, the number of unusable addresses can be reduced as small as possible and the memory can be further effectively used.

Figure 9:
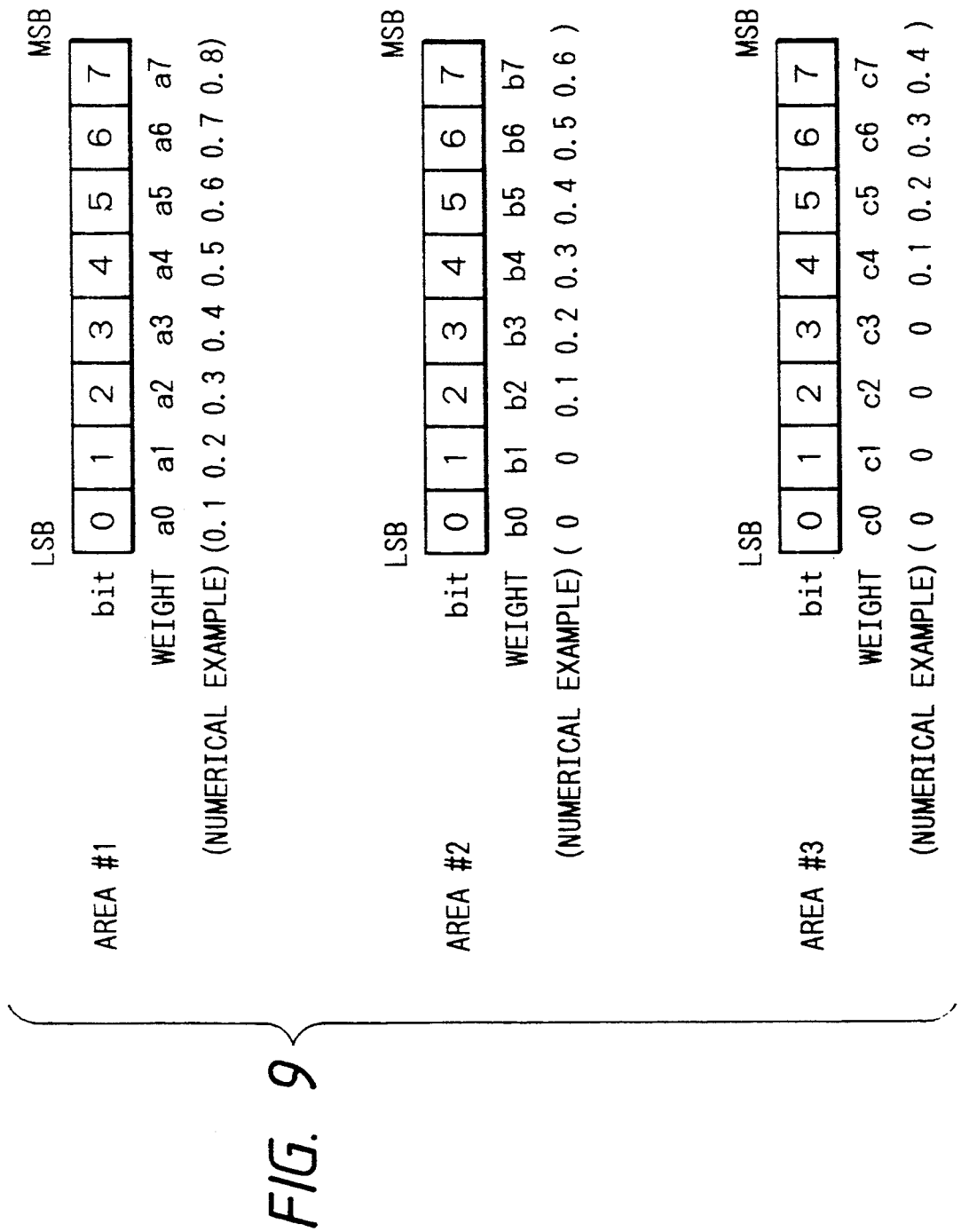
FIG. 9 is an explanatory diagram regarding another example of a weight coefficient of every bit for the/data in each area in FIGS. 4A and 4B.

FIG. 9 shows another numerical value example of the weight coefficients of the three divided areas #1, #2, and #3.

In the above embodiment, the weight coefficient has been changed in accordance with the position on the screen and discriminated by the same threshold value B. However, a similar effect can be also obviously obtained by setting the weight coefficient to the same value irrespective of the position on the screen and by changing the threshold value B in accordance with the position on the screen. Both of the weight coefficient and the threshold value B for evaluation can be also obviously changed in accordance with the position on the screen.

As will be obviously easily understood from the above description, according to the apparatuses described above in FIGS. 1 to 9, only when an error exists in a relatively high-order bit which exerts an adverse influence on the image, the use of such a memory location is inhibited, so that the memory can be effectively used as a whole. On the other hand, by evaluating the memory error at the edge of the screen so as to be lower than the memory error in the central portion of the screen, the number of memory locations whose use is inhibited is reduced and the memory can be effectively used as a whole. Further, since the memory location having a memory error that is equal to or larger than a predetermined value in the central portion of the screen is moved to the edge of the screen, the memory can be effectively used and a high picture quality can be maintained irrespective of the memory error.

Figure 10:
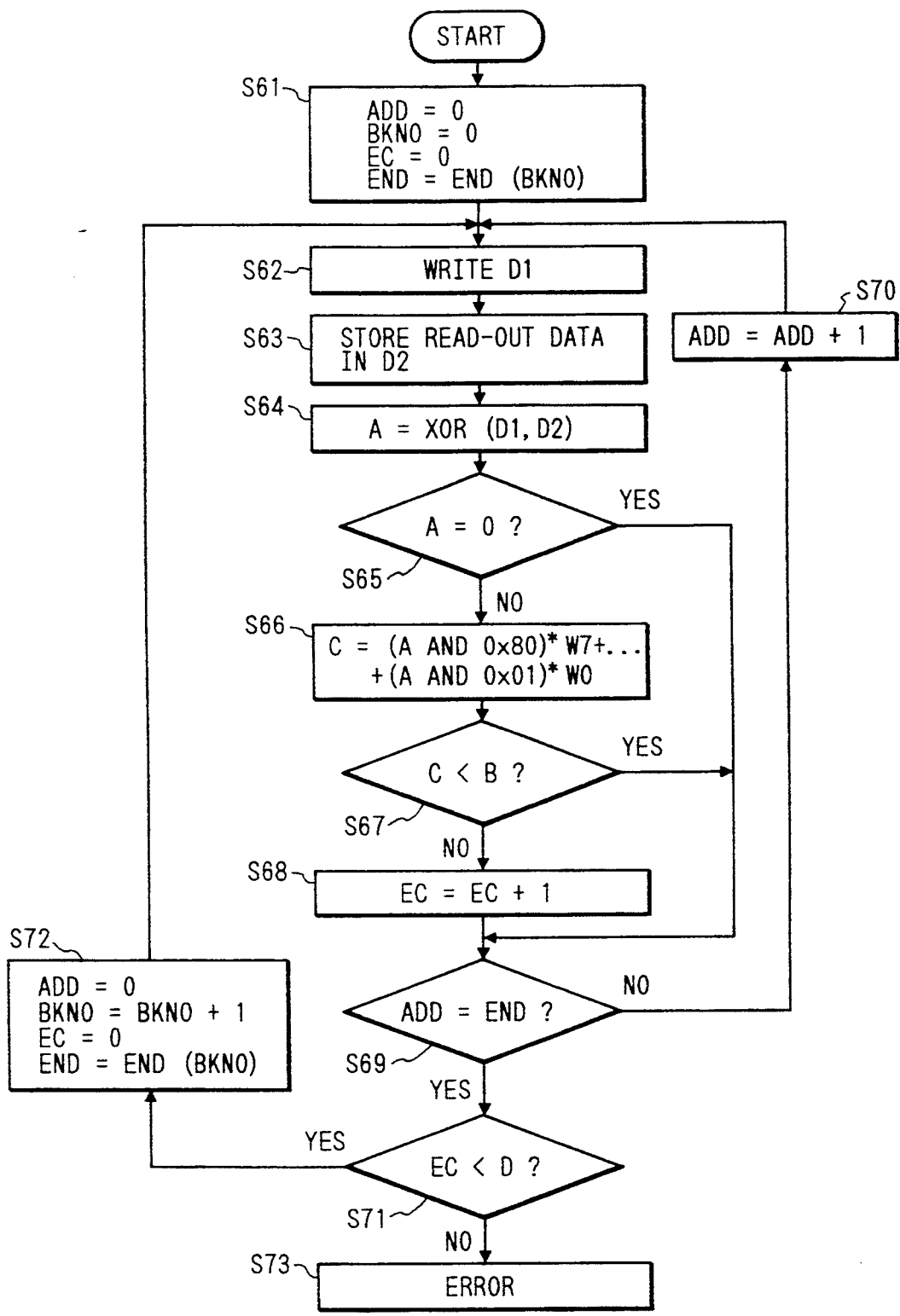
FIG. 10 is a flowchart showing the fourth operation example of the memory checking circuit in FIG. 1.

FIG. 10 is a flowchart showing the fourth operation example of the memory checking circuit 22 in FIG. 1. The memory checking circuit 22 first initializes the variable which is necessary for examination (S61). ADD denotes the address in the memory 10; EC indicates an error counter; BKNO a block number; and END(BKNO) a function to return the last address of the memory block which is expressed by the block number BKNO. The last address is stored into a variable END.

Since the processes in steps S62 to S67 in FIG. 10 are substantially the same as those in steps S2 to S7 in FIG. 2, their descriptions are omitted here.

The evaluation value C obtained in step S66 is compared with the threshold value B for subjective evaluation (S67). When C is equal to or larger than B, the count value of the error counter EC is increased by "1" (S68).

When the written data $D_1$ coincides with the read-out data $D_2$ (S65), steps S66, S67, and S68 are skipped.

Until the address ADD reaches the last address END of the memory block corresponding to the pixel block comprising a set of close pixels on the screen (S69), the address ADD is increased (S70) and coincidence/dissidence between the written data and the read-out data are checked with respect to each address (S62 to S68).

When the coincidence/dissidence discriminating process is finished until the last address END of the target memory block (S69), the count value of the error counter EC is checked and compared with the threshold value D indicative of the number of permitted errors for the block (S71). When EC is equal to or larger than D (S71), it is regarded that the memory error is serious, so that the content of the address conversion table 24 is rewritten so as to inhibit the use of such a block (S73). On the contrary, when EC is smaller than D, it is decided that the influence by the error is small, so that the memory block is continuously used and the next block is checked (S72). That is, ADD is set to "0", BKNO is increased, EC is set to "0", and the last address for a new memory block is stored into END.

Figure 11:
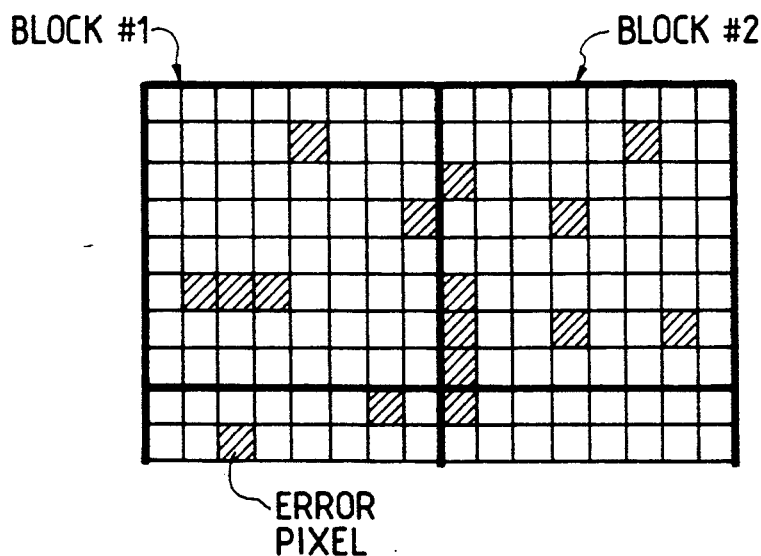
FIG. 11 is a diagram for explaining a memory error evaluation of every block.

FIG. 11 is a diagram for explaining an example of the results of the block forming process of the screen and the above error examination. In the example of FIG. 11, one block is constructed by (8 pixels×8 pixels) and an error up to six pixels is permitted. A hatched portion indicates the pixel with an error. The memory block corresponding to the block #1 is used as it is because the number of pixels or the error is equal to five. On the other hand, the memory block corresponding to the block #2 is not used because the number of pixels of the error is equal to eight.

By the above processes, the error location which exerts an adverse influence on the image to be stored can be previously eliminated from the memory 10 on a predetermined block unit basis.

The threshold value B for error discrimination in the block and the threshold value D of the number of errors can be also changed every block, for instance, in accordance with the position on the screen. It is preferable to make severe the error discrimination with respect to the central portion of the screen of a high significance and to reduce the number of permitted errors.

In the above embodiment shown in FIGS. 10 and 11, the number of memory errors in the memory block corresponding to the pixel block comprising a plurality of close pixels is counted and the number of errors is evaluated. Therefore, even when a small number of memory errors which don't exert an adverse influence on the image occur, the use of such a memory block is not inhibited, so that the memory can be efficiently used. That is, if a small number of memory errors in each pixel clock are interpolated by using the close pixels, a deterioration of the image doesn't occur from a viewpoint of a visual sense.

Figure 12:
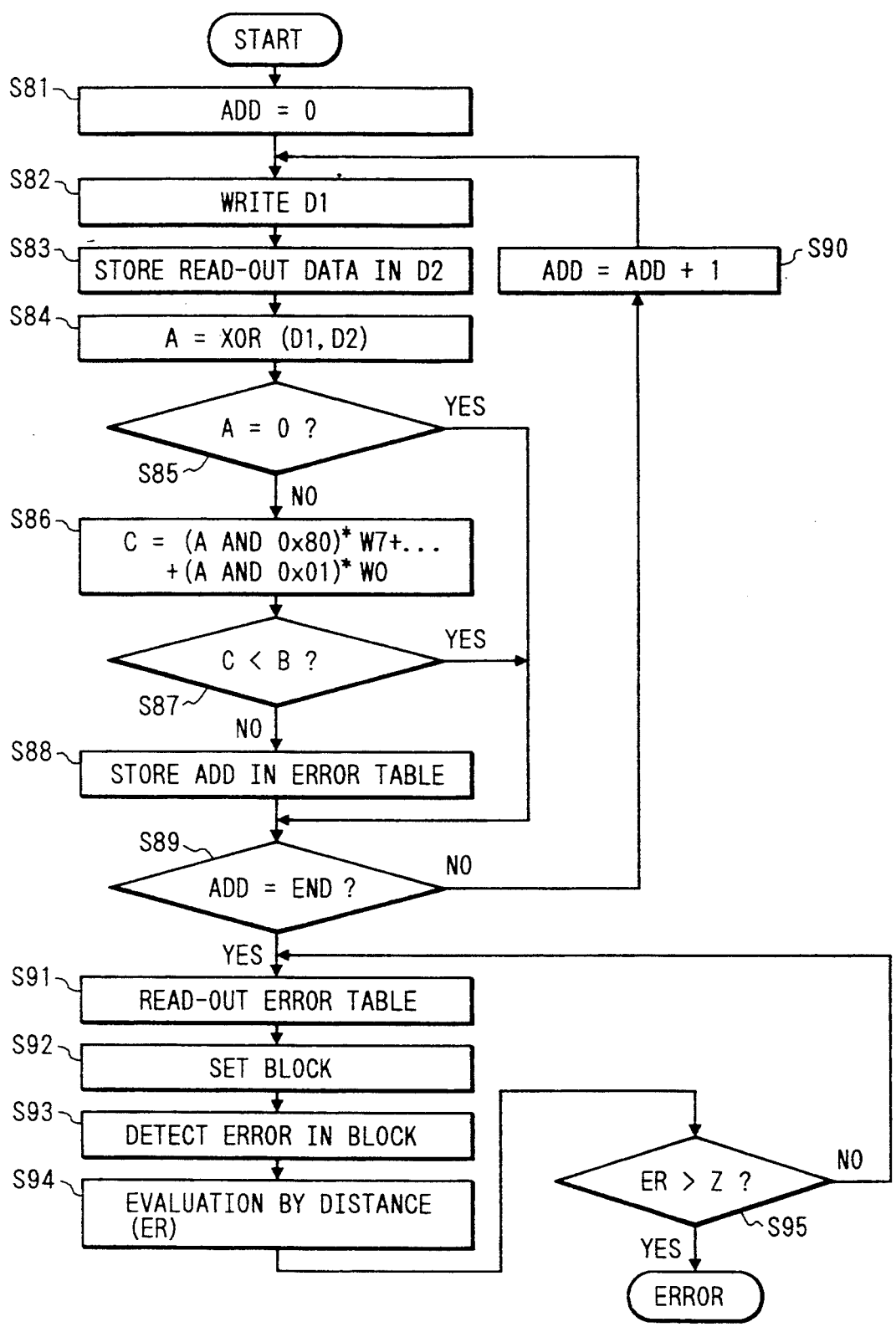
FIG. 12 is a flowchart showing the fifth operation example of the memory checking circuit in FIG. 1.

FIG. 12 is a flowchart showing the fifth operation example of the memory checking circuit 22 in FIG. 1. In the diagram, since the processes in steps S81 to S87 are substantially the same as those shown in steps S1 to S7 in FIG. 2, their descriptions are omitted here.

The evaluation value C obtained in step S86 is compared with the threshold value B for subjective evaluation (S87). In the fifth example, when C is equal to or larger than B, the address ADD is stored into the error table (S88).

When the written data $D_1$ coincides with the read-out data $D_2$ (S85), steps S86 to S88 are skipped.

Until the address ADD reaches the last address END of the memory 10 (S89), the address ADD is increased (S90) and the coincidence/dissidence between the written data and the read-out data are examined with respect to each address (S82 to S88).

When such a discriminating step is finished until the last address END (S89). The addresses (error addresses) registered in the error table are sequentially read out (S91). The block of (9×9) pixels are set every four pixels in each of the horizontal and vertical directions around the read-out error address (or pixel) as a center (S92). A check is made to see if another error address (or pixel) exists in such a block or not (S93). When another error address exists, a reciprocal number ER of the distance is calculated. When there are a plurality of errors in areas other than the center of the block, as shown in FIG. 13, the distance from the center pixel to each error pixel is calculated and the sum of the reciprocal numbers of the distances is set to the evaluation value ER.

The evaluation value ER is compared with a predetermined threshold value Z (S15). When the evaluation value ER is larger than Z, the access in the address is inhibited in the address conversion table 24 (S16).

As mentioned above, with regard to each address (pixel) stored in the error table, a degree of approach to each of the other error addresses is evaluated. Only when many errors each of which occurs at an address close to the target address by a predetermined distance or more exist, the use of such an address is inhibited.

Figure 13:
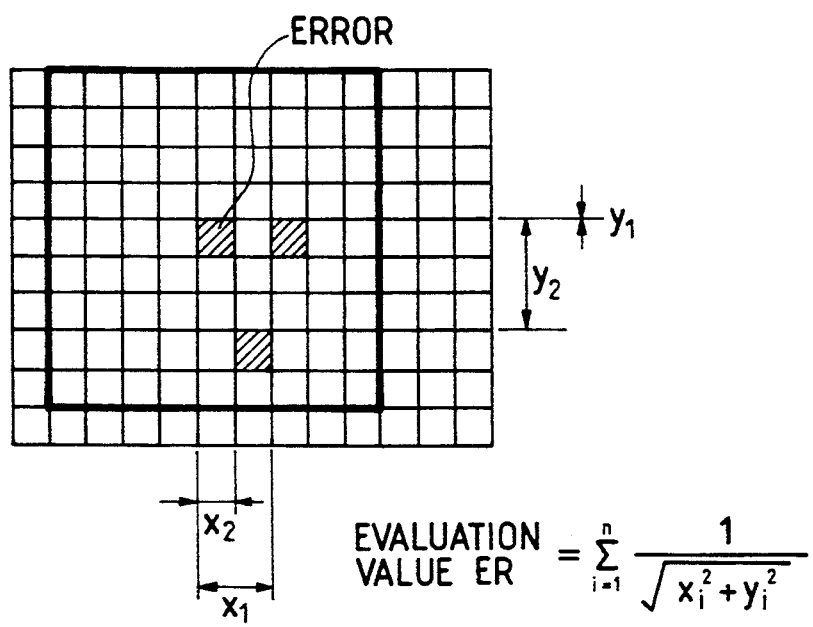
FIG. 13 is a diagram for explaining a memory error evaluation due to a distance on the screen.

As will be easily understood from the above description, according to the embodiment of FIGS. 12 and 13, the memory area having a certain number of memory errors can be also effectively used. In addition, since the use of the address is inhibited when the error is located at a close position on the screen, the image quality doesn't deteriorate.

What is claimed is:

1. An image storing device comprising:
   (a) memory means for storing image data;
   (b) detecting means for detecting whether image data to be written into said memory means coincides with image data read out from said memory means or not on the unit basis of predetermined data amount to generate detection data;
   (c) evaluating means for evaluating weight of said detection data generated by said detecting means in accordance with weight of the corresponding image data in an image to generate evaluation data; and
   (d) control means for controlling an access to the corresponding portion of the memory means in accordance with said evaluation data.

2. A device according to claim 1, wherein each said image data consists of a plurality of pixel data each including a plurality of bits, said predetermined data amount corresponds to one bit, and said evaluating means evaluates weight of said detection data in accordance with the position of the corresponding bit in the plurality of bits.

3. A device according to claim 2, wherein said control means inhibits the access to the corresponding portion of said memory means on the unit basis of the pixel data.

4. A device according to claim 2, wherein said control means inhibits the access to the corresponding portion of said memory means on the unit basis of a predetermined number of pixel data.

5. A device according to claim 1, wherein said predetermined data amount corresponds to one pixel and said evaluating means evaluates weight of said detection data in accordance with the position of the corresponding pixel on a screen.

6. A device according to claim 5, wherein said control means inhibits the access to the corresponding portion of said memory means on the unit basis of pixel data.

7. A device according to claim 5, wherein said control means converts the address of the corresponding portion of said memory means in accordance with the evaluation data.

8. A device according claim 1, wherein said predetermined data amount corresponds to one pixel, said detection data is binary data indicating whether the memory cell corresponding to each pixel is available or unavailable, and said evaluating means generates said evaluation data in accordance with a density of the unavailable memory cell.

9. A device according to claim 8, wherein said control means inhibits the access to the corresponding portion of said memory means on the unit basis of said pixel data.

10. A device according to claim 8, wherein said control means inhibits the access to the corresponding portion of said memory means on the unit basis of a predetermined number of pixel data.

11. A device according to claim 8, wherein said evaluating means includes means for calculating distance between a plurality of pixels corresponding to the unavailable memory cells.

12. A device according to claim 8, wherein said evaluating means includes means for counting the number of said detection data indicative of the unavailable memory cell in said plurality of detection data which corresponds to a plurality of pixels being adjacent to each other.

13. An image storing device comprising:
   (a) memory means for storing image data;
   (b) detecting means for detecting whether image data to be written into said memory means coincides with image data read out from said memory means or not on the unit basis of predetermined data amount to generate detection data;
   (c) evaluating means for evaluating weight of said detection data generated by said detecting means in accordance with weight of the corresponding image data in an image to generate evaluation data; and
   (d) converting means for converting an address of the corresponding portion in said memory means in accordance with said evaluation data.

14. A device according to claim 13, wherein said predetermined data amount corresponds to one pixel and said evaluating means evaluates weight of said detection data in accordance with the position of the corresponding pixel on a screen.

15. A device according to claim 14, wherein said converting means converts the address of the corresponding portion from the address corresponding to the high weight position into the address corresponding to the low weight position.

16. An image storing device comprising:
   (a) memory means for storing image data which consists of a plurality of pixel data each including a plurality of bits;
   (b) detecting means for detecting whether image data to be written into said memory means coincides with image data read out from said memory means or not on the unit basis of one bit to generate detection data;
   (c) evaluating means for evaluating weight of said detection data generated by said detecting means in accordance with weight of the corresponding bit in the plurality of bits to generate evaluation data; and
   (d) control means for controlling an access to the corresponding portion of said memory means in accordance with said evaluation data.

17. A device according to claim 16, wherein said evaluating means further evaluates the weight of said detection data in accordance with the weight of the position of the corresponding pixel on a screen.

18. An image storing device comprising:
   (a) memory means for storing image data;
   (b) detecting means for detecting whether image data to be written into said memory means coincides with image data read out from said memory means or not on the unit basis of pixel data to generate detection data;
   (c) evaluating means for evaluating weight of the detection data in accordance with weight of the corresponding image data in an image on the unit basis of a pixel block including a plurality of adjacent pixels to generate evaluation data; and
   (d) control means for controlling an access to the corresponding portion of said memory means on the unit basis of the pixel block in accordance with said evaluation data.

19. A device according to claim 18, wherein said detection data is binary data indicating whether a memory cell corresponding to each of the pixels is available or unavailable, and said evaluating means includes means for counting the number of said detection data indicative of the unavailable memory cell in a plurality of said detection data corresponding to said pixel block.

20. An image storing device comprising:
   (a) memory means for storing image data;
   (b) detecting means for detecting whether image data to be written into said memory means coincides with image data read out from said memory means or not on the unit basis of pixel data to generate detection data which is binary data indicating whether a memory cell corresponding to each pixel is available or unavailable; and
   (c) control means for controlling an access to the corresponding portion of the memory means in accordance with a density of said binary data indicative of the unavailable memory cell.

21. A device according to claim 20, wherein said control means includes means for counting the number of said binary data indicative of the unavailable memory cell in a plurality of said binary data corresponding to a pixel block consisting of a plurality of adjacent pixels.

22. A device according to claim 21, wherein said control means inhibits the access to the corresponding portion of said memory means on the unit basis of the pixel block.

23. A device according to claim 20, wherein said evaluating means includes means for calculating distances between a plurality of pixels corresponding to the unavailable memory cells.

24. An image storing device comprising:
   (a) memory means for storing image data;
   (b) detecting means for detecting whether image data to be written into said memory means coincides with image data read out from said memory means or not on the unit basis of pixel data to generate detection data which is binary data indicating whether a memory cell corresponding to each of the pixels is available or unavailable; and
   (c) control means for controlling an access to the corresponding portion of the memory means in accordance with a distance between a plurality of pixels corresponding to the unavailable memory cells.

25. A device according to claim 24, wherein said control means inhibits the access to the corresponding portion of said memory means on the unit basis of one pixel data.

26. An image storing device comprising:
   (a) a memory for storing image data;
   (b) detecting means for detecting whether each unit portion of the memory is available or unavailable;
   (c) evaluating means for evaluating weight of image data corresponding to the unavailable portion detected by said detecting means; and
   (d) control means for controlling an access to the corresponding portion of the memory according to the evaluated result of the evaluating means.

27. A device according to claim 26, wherein said unit portion corresponds to one bit of the image data.

28. A device according to claim 26, wherein said unit portion corresponds to one pixel.

29. A device according to claim 26, wherein said control means controls the access on the unit basis of one pixel.

30. A device according to claim 26, wherein said control means controls the access on the unit basis of a pixel block consisting of a plurality of pixels.

31. An image storing device comprising:
(a) a memory for storing image data;
(b) detecting means for detecting whether each unit portion of the memory is available or unavailable;
(c) evaluating means for evaluating weight of image data corresponding to the unavailable portion detected by said detecting means; and
(d) conversion means for converting address of the corresponding portion of the memory according to the evaluation result of the evaluating means.

* * * * *

UNITED STATES PATENT AND TRADEMARK OFFICE
CERTIFICATE OF CORRECTION

PATENT NO. : 5,394,525
DATED : February 28, 1995
INVENTOR(S) : Ichiro Kuwana, et al It is certified that error appears in the above-indentified patent and that said Letters Patent is hereby corrected as shown below:

Column 4, line 8, amend "diamong" to read --diamond--.

Column 4. line 35, amend "comapred" to read --compared--.

Column 6, line 65, amend "or" to read --of--.

Signed and Sealed this

Eighteenth Day of July, 1995

Attest:

BRUCE LEHMAN

*Attesting Officer*     *Commissioner of Patents and Trademarks*